May 19, 1970 E. O. GILBERT ET AL 3,513,404

MODE-SWITCHABLE AMPLIFIER STABILIZED AGAINST DRIFT

Filed Oct. 26, 1966 4 Sheets-Sheet 1

INVENTOR
EDWARD O. GILBERT
ROBERT M. HOWE

BY Richard G. Stephens

ATTORNEY

MODE-SWITCHABLE AMPLIFIER STABILIZED AGAINST DRIFT

Filed Oct. 26, 1966 4 Sheets-Sheet 2

INVENTOR
EDWARD O. GILBERT
ROBERT M. HOWE

BY Richard G. Stephens

ATTORNEY

MODE-SWITCHABLE AMPLIFIER STABILIZED AGAINST DRIFT

Filed Oct. 26, 1966 4 Sheets-Sheet 3

INVENTOR
EDWARD O. GILBERT
ROBERT M. HOWE

BY Richard L. Stephens

ATTORNEY

MODE-SWITCHABLE AMPLIFIER STABILIZED AGAINST DRIFT

Filed Oct. 26, 1966 4 Sheets-Sheet 4

INVENTOR
EDWARD O. GILBERT
ROBERT M. HOWE

BY Richard G. Stephens

ATTORNEY

United States Patent Office 3,513,404

Patented May 19, 1970

3,513,404

MODE-SWITCHABLE AMPLIFIER STABILIZED AGAINST DRIFT

Edward O. Gilbert and Robert M. Howe, Ann Arbor, Mich., assignors to Reliance Electric Company, a corporation of Delaware Filed Oct. 26, 1966, Ser. No. 589,564
Int. Cl. H03f *1/02*
U.S. Cl. 330—9 13 Claims

ABSTRACT OF THE DISCLOSURE

DC amplifier systems using a plurality of DC preamplifiers which are selectively DC-coupled to a DC output amplifier through a selective switching circuit, and a feedback signal is applied from the output amplifier to each preamplifier. A continuous DC signal path extends from the selected preamplifier input through the switching circuit and the output amplifier and the gain of the preamplifiers reduce error which voltage offsets introduced by the switching circuit otherwise would cause. Provision of the continuous DC signal path allows selective switching to convert the system into different DC operational amplifier modes, and a three-mode integrator circuit is shown. Use of electronic selector switches in the switching circuit to automatically control selection of a preamplifier in accordance with the relationship between preamplifier output signal magnitudes provides improved computer limiter circuits. The preamplifiers may be drift-stabilized to provide overall circuit accuracy, and feedback limiters are used to prevent saturation of stabilizer channels connected to non-selected preamplifiers.

Figure 1:
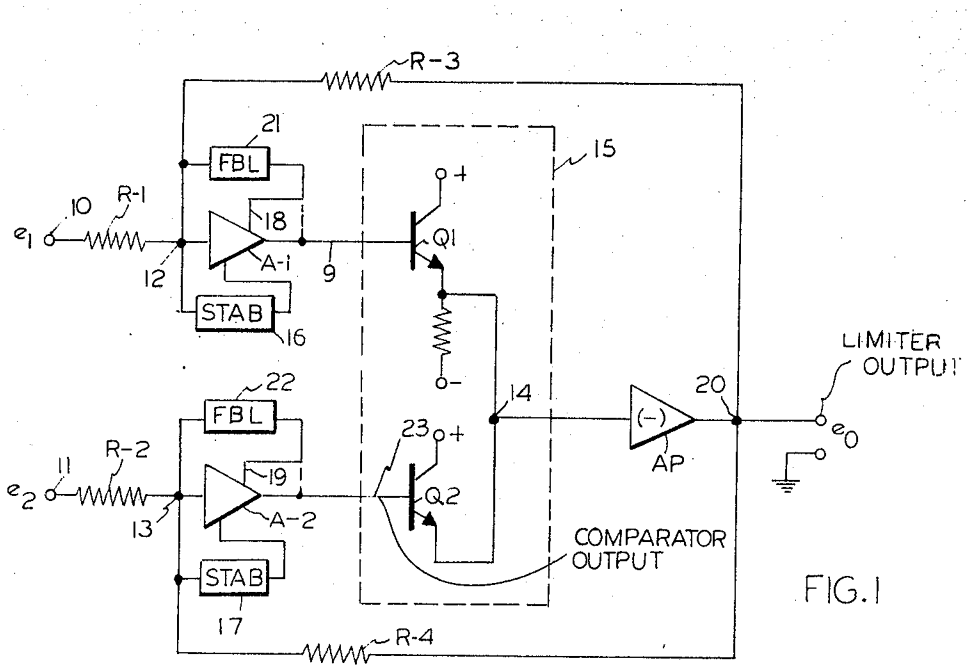

Our invention relates to improved analog computer amplifier circuits, including improved comparison and limit-detecting circuits and amplifiers having improved switching circuits, and also includes amplifier apparatus which may be reconnected or switched easily to function either as a comparator or a limit-detecting circuit, as a mode-switchable amplifier, or a combination of the foregoing. In the analog computer, hybrid analog-digital computer, automatic control and instrumentation arts, a wide variety of applications involve the detection of the instants when various dynamic quantities reach or exceed various limit values or change relative polarities. The usual function of an elementary "limiter" circuit is to receive an input signal and a limit signal, and to provide an output signal which is a replica of the input signal (though perhaps inverted in sign) as long as the magnitude of input signal does not exceed the magnitude of the limit signal, but to provide an output signal at the prescribed magnitude if the input signal exceeds such magnitude, and to continue to provide an output signal at the prescribed magnitude level so long as the input signal exceeds the prescribed magnitude, no matter how much the input signal exceeds the prescribed magnitude. Otherwise stated, the input-output characteristic of an ideal limiter is directly proportional, or of fixed slope, for input signal values less than the prescribed limit value, and of zero slope for input signal values exceeding the prescribed limit value. Frequently, limiter circuits are made bidirectional, to limit at both an upper level and a lower level, so that the limiter characteristic has a predetermined slope between the upper and lower limit levels, and zero slope (ideally) outside either limit level.

The usual function of a comparison circuit, or comparator, is to receive two (or sometimes more) input signals, to provide a Boolean logic "1" output signal whenever signal No. 1 exceeds signal No. 2, and to provide a logic "0" signal whenever signal No. 2 exceeds signal No. 1.

Most limiter circuits of the prior art have been incapable of truly zero-slope operation outside their limit values unless either special voltage sources or special high current sources are provided, or unless the operating ranges of such prior circuits have been drastically circumscribed. Prior art limiter circuits also have been imperfect in that their operating characteristics have included an undesirable "rounding" at the limit points due to rounding in the characteristics of diodes arranged to switch between "off" and "on" conditions at respective limit points. The improved limiter circuit shown in Appl. Ser. No. 412,481 filed by Edward O. Gilbert overcomes many of the limitations of prior art limiter circuits, but still undesirably includes some rounding in its characteristic. While the improved Gilbert limiter offers greatly improved operation, it is undesirably expensive and inflexible compared to the present invention.

The relative numbers of summing amplifier, integrators, limiters and other computer building blocks which are needed to solve a given problem depend largely on the details of the problem itself, with the "mix" varying greatly with different types of problems. An important feature of the circuit of the present invention is that it is readily convertible from a comparison or a limiter circuit to a switching circuit, or to a mode-switchable amplifier, such as an integrator circuit switchable between the conventional "operate," "reset" and "hold" modes, thereby multiplying the utility of a given amount of capital investment. When connected to function as a limiter, a circuit constructed in accordance with the present invention has the advantage over the above-mentioned Gilbert limiter and most other prior limiters, that the effect of diode rounding is substantially completely eliminated. When connected as a mode-switchable integrator, the circuit of the present invention is advantageous in that extremely fast reset action may be obtained, and in that a very long "hold" time-constant may be obtained, and further advantageous in that very simple and inexpensive switches may be utilized without degrading computer accuracy. The switching techniques utilized in the present invention also will be seen, as the description proceeds, to be useful for numerous switching applications, including various multiplexing applications.

Thus it is a primary object of the present invention to provide an analog computer circuit which may be readily and simply converted, with very little change in hardware, to function as a comparator, a limit-detecting circuit, or a switching or mode-switchable circuit.

It is another object of the invention to provide an improved limiter circuit having improved slope characteristics which is fast and accurate, which is economical and does not require special high voltage or high current sources, and which has little or no significant rounding at a limit point in its operating characteristic.

It is another object of the invention to provide an improved mode-switchable amplifier circuit which is both stabilized against drift and switchable rapidly between various operating configurations or modes without becoming saturated or disabled or grossly inaccurate, and wherein components associated with certain modes do not become disabled for substantial recovery times when the circuit is switched into or out of such modes.

It is yet another object of the invention to provide apparatus of the type mentioned which is capable of providing overload indications when the apparatus becomes overloaded.

Another object of the invention is to provide improved comparator apparatus.

The invention accordingly comprises the features of construction, combinations of elements, and arrangement of parts, which will be exemplified in the constructions hereinafter set forth, and the scope of the invention will be indicated in the claims.

Figure 3B:
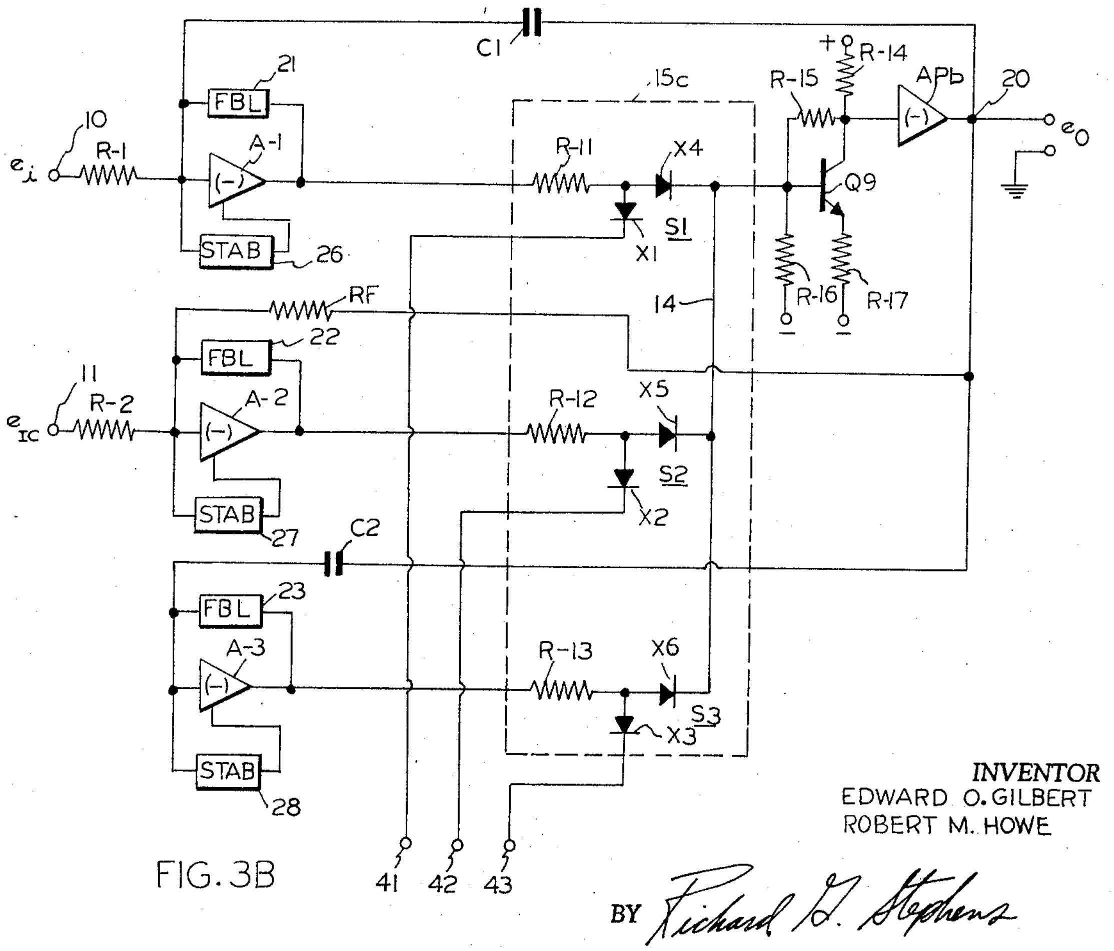
Figure 3A:
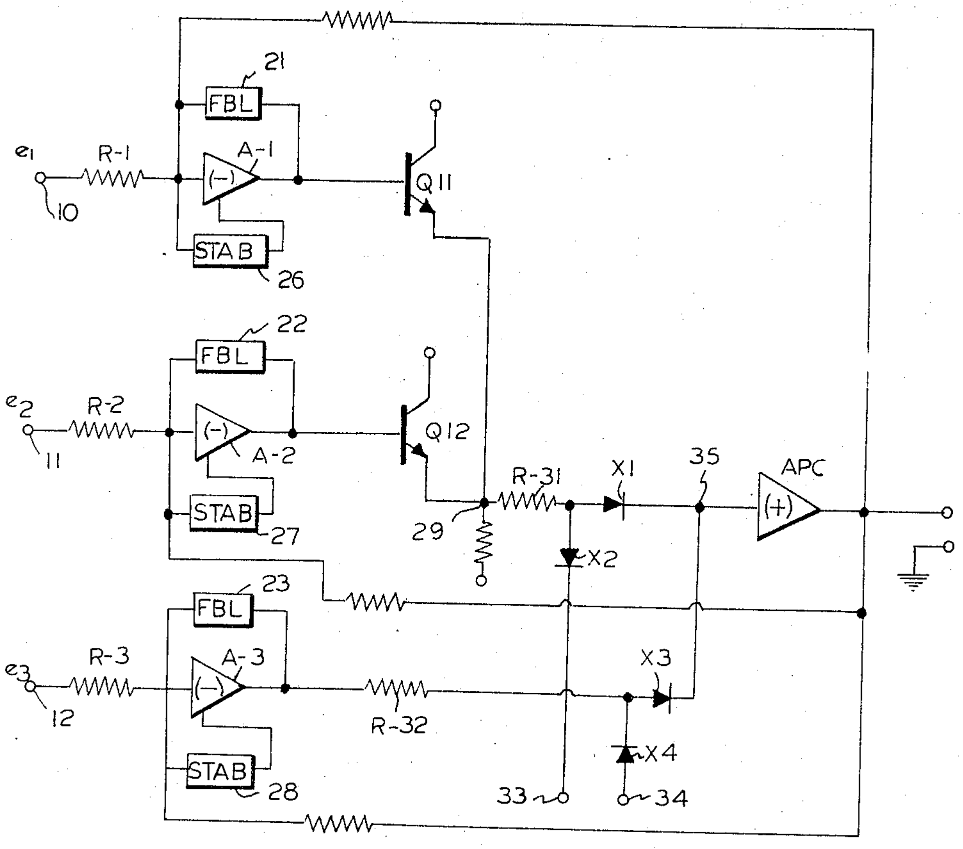
Figure 1A:
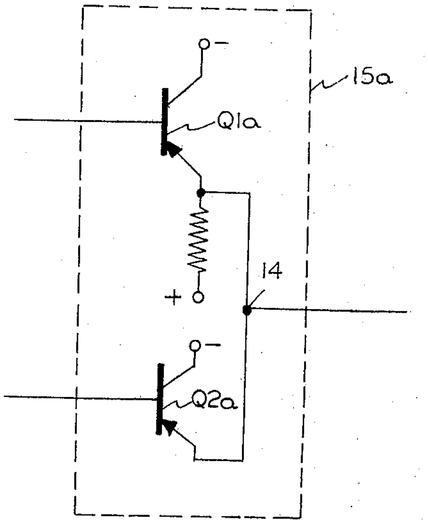
Figure 2:
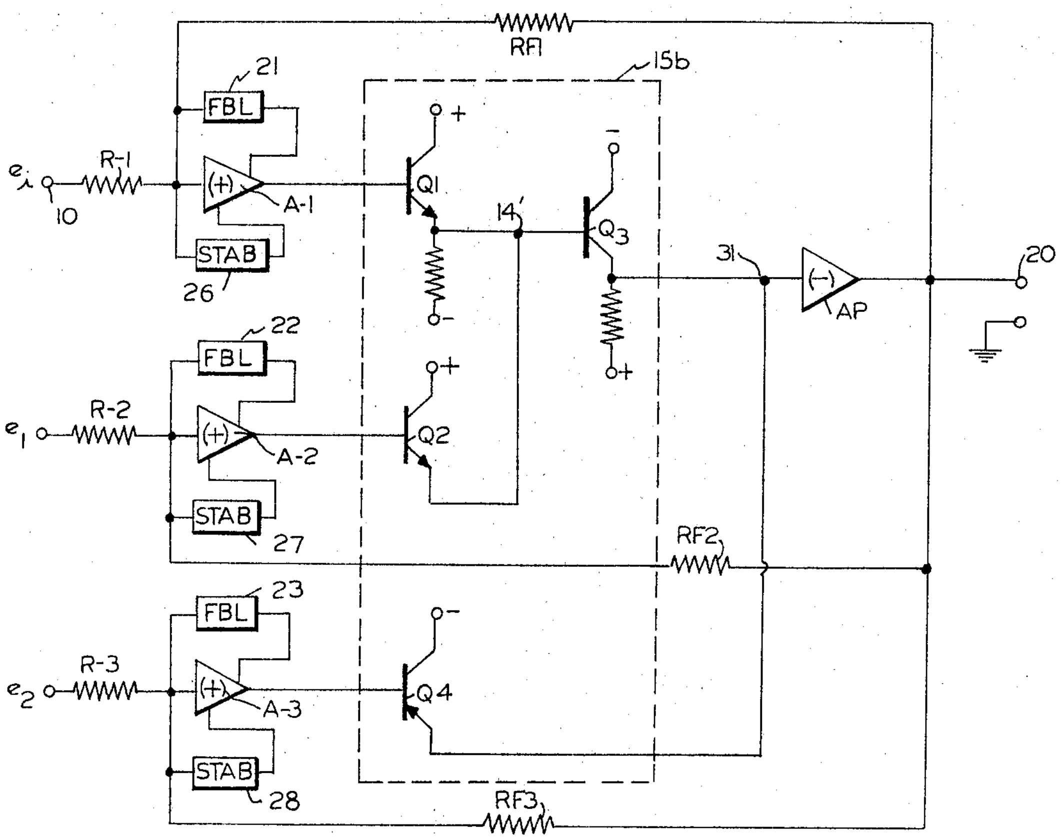
Figure 2A:
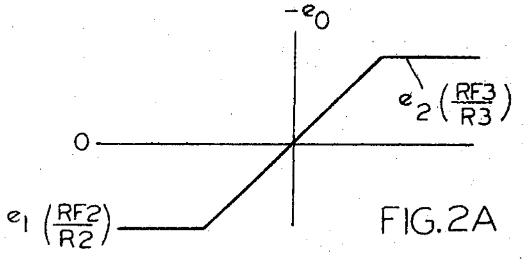
Figure 2B:
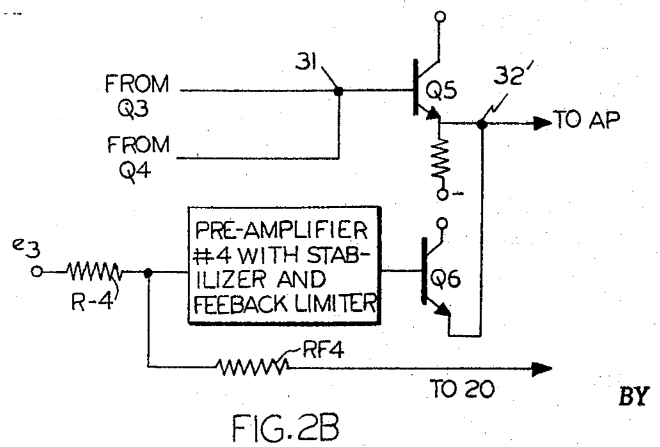
Figure 2C:
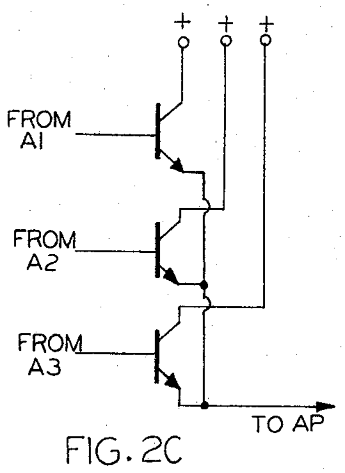

For a fuller understanding of the nature and objects of the invention reference should be had to the following detailed description taken in connection with the accompanying drawings, in which:

FIG. 1 is an electrical schematic diagram, largely in block form, illustrating one embodiment of the invention connectetd to function either as a single-limit limiter circuit or as a simple comparison circuit;

FIG. 1*a* is an electrical schematic diagram illustrating an alternative switching circuit which may be substituted into FIG. 1 to provide an opposite type of operation;

FIG. 2 is an electrical schematic diagram, largely in block form, illustrating another embodiment of the invention connected to function either as a bidirectional limiter circuit or as a dual point comparator circuit;

FIG. 2*a* is a graphical illustration of the operating characteristic of the limiter circuit of FIG. 2;

FIG. 2*b* is an electrical schematic diagram, partially in block form, illustrating certain additions and modifications which may be made to FIG. 2 to provide an alternative type of limiting characteristic;

FIG. 2*c* is an electrical schematic diagram illustrating certain different modifications which may be made to FIG. 2 to provide switching or multiplexing of a different number (three) of input variables;

FIG. 3*a* is a schematic diagram of a form of the invention in which both internally and externally generated control signals are used to control the circuit of the invention;

FIG. 3*b* is an electrical schematic diagram of one embodiment connected to provide a particular type of mode-switchable amplifier circuit; specifically, a fast-reset integrator which may be switched between "operate," "hold" and "reset" modes.

Referring now to FIG. 1, one embodiment of the improved amplifier circuit of the present invention is shown as including a plurality (only two are shown in FIG. 1) of preamplifiers A1, A2, each of which has its input circuit connected to a respective summing junction (12, 13) at which currents through respective input impedances (R1, R2) are summed with currents through respective feedback impedances, the latter being shown as simple resistances R3 and R4 in FIG. 1. The output signal of each preamplifier is applied via a switching circuit (shown within dashed lines at 15 in FIG. 1) which selectively connects one or the other of the preamplifier output signals to further amplifier means AP, which generally will take the form of a power amplifier.

The circuit will be seen to include two primary or major closed loops, the first being through amplifiers A1 and AP and feedback impedance R3, and the second loop being through amplifier A2 and AP and feedback impedance R4. In accordance with the invention, each such closed loop is provided with high loop gain, and an overall sign inversion so that the feedback currents through R3 and R4 are degenerative. It may be noted that high loop gain may be provided by the provision of high gain in the preamplifiers A1 and A2, with unity or fractional gain being provided in amplifier AP, or conversely, by the provision of high gain in amplifier AP and unity or fractional gain in preamplifiers A1 and A2, or thirdly, and perhaps most usual, by the provision of substantial gain in all three amplifiers. (If the gains are unity or low in amplifiers A1 and A2, various advantages of the invention, such as overcoming "diode-rounding" will not be accomplished, but the circuit otherwise will be useful.)

In order to provide an overall sign inversion in each major loop, preamplifiers A1 and A2 both may be made overall noninverting, in which case amplifier AP must be overall inverting, or instead, preamplifiers A1 and A2 may be made to invert, in which case amplifier AP should be non-inverting. In FIG. 1 amplifiers A1 and A2 are assumed overall not to invert, as indicated by + signs in parenthesis, while amplifier AP is assumed to be inverting, as indicated by a negative sign (−).

In FIG. 1 an input voltage $e_1$ is applied to terminal 10 and input resistor R1, an input voltage $e_2$ is applied to terminal 11 and input resistor R2, and the circuit output voltage at terminal 20 of amplifier AP is designated $e_0$. Assume that R1 equals R3 and that R2 equals R4, so that both major loops have unity gain. Now assume, for example, that $e_1$ is +10 volts and $e_2$ equals zero volts. The positive input to noninverting A1 provides a positive-output which passes through NPN transsitor Q1 to provide a positive input to inverting amplifier AP, thereby providing a negative-going output ($-e_1$) at output terminal 20, so that $e_0=-e_1$. With $-e_1$ applied via R4 and zero volts applied via R2, summing junction 13 is driven negative, providing a negative output from noninverting amplifier A2, thereby cutting off NPN transistor Q2, so that the A2 preamplifier output is disconnected from the AP amplifier input circuit. If, however, input voltage $e_1$ becomes less than (i.e., less positive than, or more negative than) voltage $e_2$, it may readily be shown that the output voltage $\lambda_0$ will become $-e_2$, and that transistor Q1 will then be cut off and Q2 will then be turnetd on. The following two equations specify the operation of the limiter or comparator circiut of FIG. 1:

$$e_0=-e_1 \text{ if } e_1>e_2 \quad (1)$$
$$e_0=-e_2 \text{ if } e_1<e_2 \quad (2)$$

If the NPN transistor switches Q1 and Q2 of switching circuit 15 of FIG. 1 are replaced by the PNP switches Q1*a* and Q2*a* of switching circiut **15*a*** of FIG. 1*a*, it may readily be shown that circuit operation will become opposite, so that $$e_0=-e_1 \text{ if } e_1<e_2 \quad (3)$$
$$e_0=-e_2 \text{ if } e_1>e_2 \quad (4)$$

The limiter circuit of FIG. 1, and that of FIG. 1 modified in accordance with FIG. 1*a*, both are advantageous in that very sharp limiting occurs if substantial loop gains are provided in amplifiers A1 and A2. Also, any rounding inherent in the junction characteristics of each switching transistor is compressed or flattened by the amount of such gain in its respective preamplifier, so that rounding becomes insignificant. Further, it may be noted that the limit values may vary dynamically, if desired.

It is well-known that drift which occurs in a multistage amplifier is especially deleterious to accuracy if it occurs in any early stage since its effect is multiplied by the gains of following stages. It will be seen that preamplifier A1 constitutes the early stages of a multistage amplifier comprising A1 and AP when transistor Q2 is cutoff, and that preamplifier A2 constitutes the early stages of a multistage amplifier comprising A2 and AP when transistor Q1 is cutoff. Accurate computation dictates that drift occurring in the first stages of the preamplifiers be corrected for or balanced out if the limited circuit of FIG. 1 is to function accurately. It has been simple in the prior art to provide automatic drift stabilization for single major feedback loop amplifiers by means of drift-free zero and low-frequency responsive stabilizer channels usually consisting of a modulator, a plurality of AC-coupled amplifier stages, a demodulator and a low-pass filter. However, the use of such automatic drift stabilization on interconnected amplifiers such as A1 and A2 has not been practical for plural loop circuits in the prior art. Returning to the previous example where $e_1$ was +10 volts and $e_2$ was zero, so that transistor Q1 was turned on and transistor Q2 cut off, it will be seen that under such conditions summing junction 13 of amplifier A2 will tend to be driven very negative, so that a conventional stabilizer channel connected to summing junction 13 would saturate. Similarly in FIG. 1, a conventional stabilizer channel connected to summing junction 12 of amplifier A1 would tend to saturate whenever input $e_1$ is less (positive) than $e_2$ and Q1 is cut off. In either event, because of the long recovery time associated with saturation of a conventional stabilizer channel, one preamplifier or the other in FIG. 1 would always be effectively disabled and rendered unable to operate accurately for an appreciable period of time after the limit condition changed. One or the other of the two stabilizer channels would always be overdriven and saturated. Thus the prior art has been unable to provide drift stabilization on switched preamplifiers such as A1 and A2. In accordance with the present invention, however, drift stabilization is provided on preamplifiers A1 and A2 to enable accurate limit detection, and overloading or saturation of the stabilizers is prevented by means of negative feedback limiter circuits associated with each preamplifier. In FIG. 1 block 16 labelled STAB is intended to represent a conventional operational amplifier stabilizer channel comprising a modulator, one or more AC-coupled amplifier stages, a demodulator and a low-pass filter. Stabilizer channel 16 receives its input signal from summing junction 12 and applies its low frequency drift-correction signal internally within preamplifier A1 to one input of a difference-determining stage which is usually termed a "differential" amplifier. A similar stabilizer channel represented by vlock 17 corrects for drift in preamplifier A2. Whenever input $e_1$ is more positive than $e_2$, so that transistor Q2 is cut off and summing junction 13 tends to swing very negative, feedback limiter circuit 22 senses a signal excursion associated with preamplifier A2 and applies a degenerative feedback current to summing junction 13 whenever the signal excursion being sensed begins to exceed a predetermined limit value well below a stabilizer saturation value. The degenerative feedback current applied to summing junction 13 prevents summing junction 13 from ever being driven very far from zero, and hence stabilizer channel 17 is never driven into saturation. Similarly, when $e_2$ is more positive than $e_1$, so that Q1 is cut off and summing junction 12 tends to be driven negative, feedback limiter 21 senses the excursion of a voltage associated with preamplifier A1 and applies a degenerative feedback current to summing junction 12 whenever the excursion exceeds a predetermined limit value, preventing summing junction 12 from ever being driven very far from zero. An important feature of the invention is that each input circuit presents a known and substantially constant load because each feedback limiter holds its associated summing junction to very near a known fixed potential, i.e., zero volts. Thus, if limit voltage $e_2$ is to be derived from a potentiometer, for example, a potentiometer setting made when Q1 was cut off will not become grossly in error when Q2 later is cut off, as would be the case if summing junction 13 were allowed an extreme excursion when Q2 becomes cut off.

The currents applied by feedback limiters 21 and 22 to their respective summing junctions are negative, or degenerative, as mentioned above. Because the overall gain of each of amplifiers A1 and A2 from input to output of each triangle symbol has been indicated to be positive, or noninverting, as symbolized by the (+) signs, feedback limiters 21 and 22 are shown connected via lines 18 and 19 to sense signal excursions within or inside amplifier A1 and A2, presumably back one (or any odd number) inversion from the amplifier outputs. Such symbolism assumes that there is no overall signal inversion in either feedback limiter circuit 21 or 22. As mentioned above, an alternative form of the invention utilizes a signal inversion in each of amplifiers A1 and A2 and no signal inversion in amplifier AP. In such alternative, feedback limiters 21 and 22 may sense instead the outputs of amplifiers A1 and A2, as indicated by the dashed lines associated with lines 18 and 19.

When the output signal of greater interest taken from the device of FIG. 1 is that taken from terminal 20, the function of the apparatus ordinarily would be termed to be that of "limiting," as the precise level or magnitude of the signal ordinarily would be of interest. The signal at terminal 23 will be seen to swing from a high level to a relatively low level (or vice versa) as $e_1$ exceeds $e_2$ (or vice versa). Thus the output signal on line 23 ordinarliy would be said to be that of a comparator, providing a Boolean output on line 23 in accordance with a comparison of the two input signals. Thus, whether one terms the circuit of FIG. 1 to be a "comparator" or a "limiter" depends largely upon which output signal one is most interested in.

In an important further alternative form of the invention illustrated in FIG. 2, three preamplifiers are utilized with a modified switching circuit to provide a bidirectional limiting characteristic illustrated in FIG. 2*a*. Whenever input signal $e_j$ applied to terminal 10 (times $R_f/R_i$, the ratio between the impedances of feedback resistor RF1 and input resistor R1,) lies in between limits of $e_1$ and $e_2$, output signal $e_0=-R_f/R_je_1$, but whenever $e_1$ times $R_f/R_i$ becomes greater than $e_2$, the upper limit value, or less than $e_1$, the lower limit value, the output will equal the exceeded limit value. It will be apparent that the limit levels will equal $e_1$ and $e_2$ if R2 equals RF2 and if R3 equals RF3 in FIG. 2, so that the major loops including preamplifiers A2 and A3 have unity overall gain. It is by no means necessary, however, that such loops have unity overall gain. The upper limit input signal level (or lower output signal level) in FIG. 2 will be seen to be $e_2 \times RF3/R3$, and the upper output signal limit level will be seen to be $e_1 \times RF2/R2$. Each preamplifier is preferably provided with an automatic stabilizer channel as indicated at 26, 27 and 28, and with a negative feedback limiter, as indicated at 21, 22 and 23. A particularly useful alternative form of FIG. 2 results from replacing feedback resistor RF1 with a capacitor (not shown), so that the loop containing preamplifier A1, transistors Q1 and Q3, amplifier AP and the capacitor form an integrator which integrates input signal $e_1$ between upper and lower integration limits established by the signals $e_2$ and $e_1$.

While FIG. 2 shows overall noninverting preamplifiers, and shows an overall inverting power amplifier PA, it should be recognized that the three preamplifiers may be provided with overall inversion and the power amplifier with overall noninversion, if desired, following the principles mentioned above in connection with FIG. 1.

While FIG. 2 shows but three preamplifiers, it is within the scope of the invention to increase the number of preamplifiers to provide many novel functions heretofore either unknown or economically unobtainable in the computer art. It will be seen in FIG. 1 that switching circuit 15 functions like a comparator and a two-input selector switch for positive input signals, so that the most positive of two applied signals is connected through, with the remainder of FIG. 1 operating so that only one positive input signal is applied to circuit 15 at a given instant. Switching circuit 15*a* in FIG. 1*a* will be seen to comprise a two-input selector switch for negative input signals. In FIG. 2 transistors Q1 and Q2 comprise a comparator and two-input selector switch for positive signals, while transistors Q3 and Q4 function to compare and gate through the most negative of two applied signals.

It is within the scope of the present invention to utilize circuits similar to FIG. 2 but with additional preamplifiers. For example, as illustrated by the partial circuit shown in FIG. 2*b*, terminal 31 instead of being connected directly to amplifier AP as in FIG. 2, may be connected to control one input line of a further two-input selector switch comprising transistors Q5 and Q6, the other input being controlled by a further limit signal $e_3$. The Q5–Q6 switch will be seen to connect the most positive of its applied signals through to amplifier AP. Preamplifier #4 in FIG.

2*b* is also assumed to have positive gain, i.e., no overall sign inversion. If limit voltage $e_3$ becomes more negative than $e_1$, it will be seen that $$e_3 \times \frac{RF4}{R4}$$

rather than $$e_1 \times \frac{RF2}{R2}$$

will determine the negative limit.

It is also within the scope of the invention to utilize switches having more than two input lines, and also to use AND gates to combine preamplifier output signals. For example, instead of cascading successive pairs of switching elements as shown in FIG. 2, various well-known multipole selector switches may be utilized. FIG. 2*c* illustrates a modified switching circuit which may be substituted for switching circuit 15*b* of FIG. 2. In FIG. 2*c* the common emitter terminal 31*a* assumes the level of the most positive of the plural (shown as three) signals applied to the three transistor bases. Obviously, more than three inputs can be used using the technique of FIG. 2*c*.

In some applications of the invention some of the signals applied to the gate circuits will not be derived through preamplifiers, but will instead comprise predetermined or otherwise computed signals, which may be switched into gate circuits of the invention by means of digital computer signals, or by signals from completely different amplifier circuits, for example. FIG. 3*a* illustrates one form of the invention wherein the outputs of preamplifiers A1 and A2 are applied to transistors Q11 and Q12. The most positive of the two preamplifier outputs appears on the two emitters and on terminal 29, and is applied via resistor R–31 as one input of a diode OR gate for positive signals, or AND gate for negative signals. Similarly, the output of preamplifier A3 is applied via resistance R–32 and a further diode coincidence gate (X–3, X–4) to terminal 35 and amplifier AP*c*. By controlling the potentials at terminals 33 and 34, the application of the output signals of the combination of amplifiers A1 and A2, and the output of amplifier A3, to power amplifier AP*c* may be controlled.

In the previously-discussed embodiments of the invention the switching circuits were at least in part controlled by the magnitude and sense of the output voltages from the preamplifiers. In many applications of the invention the switching circuits will comprise solely externally-controlled switches, such as switches controlled solely by external digital logic signals, or by overload signals and the like. The invention has an advantage over most prior art amplifier mode-switching circuits in that very simple and inexpensive switches are perfectly fast enough and accurate enough to insure accurate computation. The drift and input current problems associated with most mode-switched amplifier circuits of the prior art are eliminated by the preamplifier circuits of the present invention. Voltage drops across the switches and current inputs to the switches cause no appreciable computation error.

In the prior art it has not been feasible to utilize mode-switching with selectable drift-stabilized preamplifiers, since the stabilizers associated with each disconnected preamplifier would be driven into saturation, rendering each such preamplifier inoperable due to its long recovery time. And even irrespective of stabilization, switching inherently introduces large transients in any feedback loop having high gain. Both of these problems are overcome in the invention by the use of negative feedback limiters at each preamplifier, in the same manner as explained above in connection with FIGS. 1 and 2. FIG. 3*b* illustrates one embodiment of the invention connected to provide integration with improved reset speed and improved long-term holding capability, utilizing simple and inexpensive switches.

Shown within dashed lines at 15*c* in FIG. 3*b* is a simple and inexpensive switching circuit comprising three diode-pair switches connected to a common line 14 to provide a three-position selector switch, only one of the three diode switches being "closed" at any given instant. During the "Operate" or "integrate" mode switch S1 is closed by application of a positive voltage to terminal 41, thereby cutting off diode X–1 and connecting the output of preamplifier A1 to transistor Q9 and amplifier AP*b*. In FIG. 3*b* preamplifiers A1, A2 and A3 all have overall sign inversion, as indicated by the (—) signs. The output power amplifier comprises transistor Q9 and amplifier AP*b* in cascade. Because the preamplifiers have overall sign inversion, the overall power amplifier should not, and therefore amplifier AP*b* is provided with sign inversion to cancel out that the the transistor Q9 circuit. During the "operate" mode, input voltage $e_1$ is integrated with respect to time in accordance with the time-constant R1, C1. Due to high loop gain the closed loop including A1, S1, Q9, AP*b* and C1, voltage drops and current leakage and the like in switch S1 have no appreciable effect on the output signal at terminal 20. During the "operate" mode switches S2 and S3 are both "open' 'by virtue of negative voltages being applied to terminals 42 and 43, and feedback limiters 22 and 23 prevent the output voltage, and changes in the output voltage, from driving either the A2 summing junction and the A3 summing junction very far away from zero, and hence stabilizer channels 27 and 28 are protected from saturation.

The circuit of FIG. 3*b* is switched from "operate" to "hold" by opening switch S1 and closing switch S3. It is important to note that during the "operate" mode the across capacitor C2, and because the A3 summing junction to which C2 is tied is maintained at all times substantially at zero by stabilizer 28, the voltage across C2 always accurately corresponds to the output voltage. Thus, when the circuit is switched to "hold" capacitor C2 is already properly charged. Because the circuit of FIG. 3*b* uses a different capacitor (C2) for holding than that (C1) used for integrating, the length of time which a voltage may be held accurately need not be limited by the integrating time-constant. In other words, a small capacitor may be used as C1 and a large capacitor as C2.

The circuit of FIG. 3*b* is switched from either "operate" or "hold" to "reset" or "initial condition" mode by closing switch S2 and having switches S1 and S3 open, so that preamplifier A2 is connected in the circuit. The output signal $e_0$ will be seen to be applied in the steady-state to the A2 summing junction via feedback resistor RF, and it will be understood then that the steady-state output signal $e_0$ after preamplifier A2 has been connected in the circuit will equal $$-e_{IC}\frac{RF}{R2}$$

It will be seen that the entire loop gain of the A2, Q9, AP*b* loop acts immediately to drive the output to such a value as soon as switch S2 is closed, and hence reset occurs very rapidly.

If capacitors C1 and C2 each are replaced by respective resistors in FIG. 3*b*, and if a third input signal is connected to the summing junction of preamplifier A3, the circuit of FIG. 3*b* will be seen to be operable as a multiplexer in which enabling of terminal 41, 42 or 43 serves to gate the output of A1, A2 or A3, respectively, to output amplifier AP*b*. It is important to note that many more than three preamplifiers may be provided, if desired, to multiplex many more than three input signals.

Comparison of FIG. 2 with FIG. 3*b* will indicate that aside from input and feedback impedances, which generally vary from problem to problem, the bidirectional limiter circuit of FIG. 2 may be identical to the fast-reset integrator of FIG. 3*b* except that the two utilize different switching circuits, as shown at 15*b* in FIG. 2 and 15*c* in FIG. 3*b*. Thus in accordance with the invention, a basic assembly comprising a plurality of preamplifiers, together with their stabilizers and feedback limiters, and a power amplifier may be provided with removable or "plug-in" switching circuits, so that the basic assembly may be used for either limiting or for mode-switching or multiplexing or the like. Switching circuits may be changed other than by use of separate "plug-in" units, of course, by using other switches to provide desired reconnection. Input and feedback impedances may be selectively connected to such assemblies in the same manner in which they are presently connected to conventional amplifiers, such as by means of a patchboard, or by punched card set switches, for example.

It should be noted that the preamplifier circuitry, the stabilizer circuitry and the feedback limiter circuitry, all of which are utilized in number, are the low power portions of the circuit, so that they become more readily susceptible to microminiaturization with the use of chips and integrated circuits, while the power amplifier portion of the assembly need be provided but once.

Figure 4:
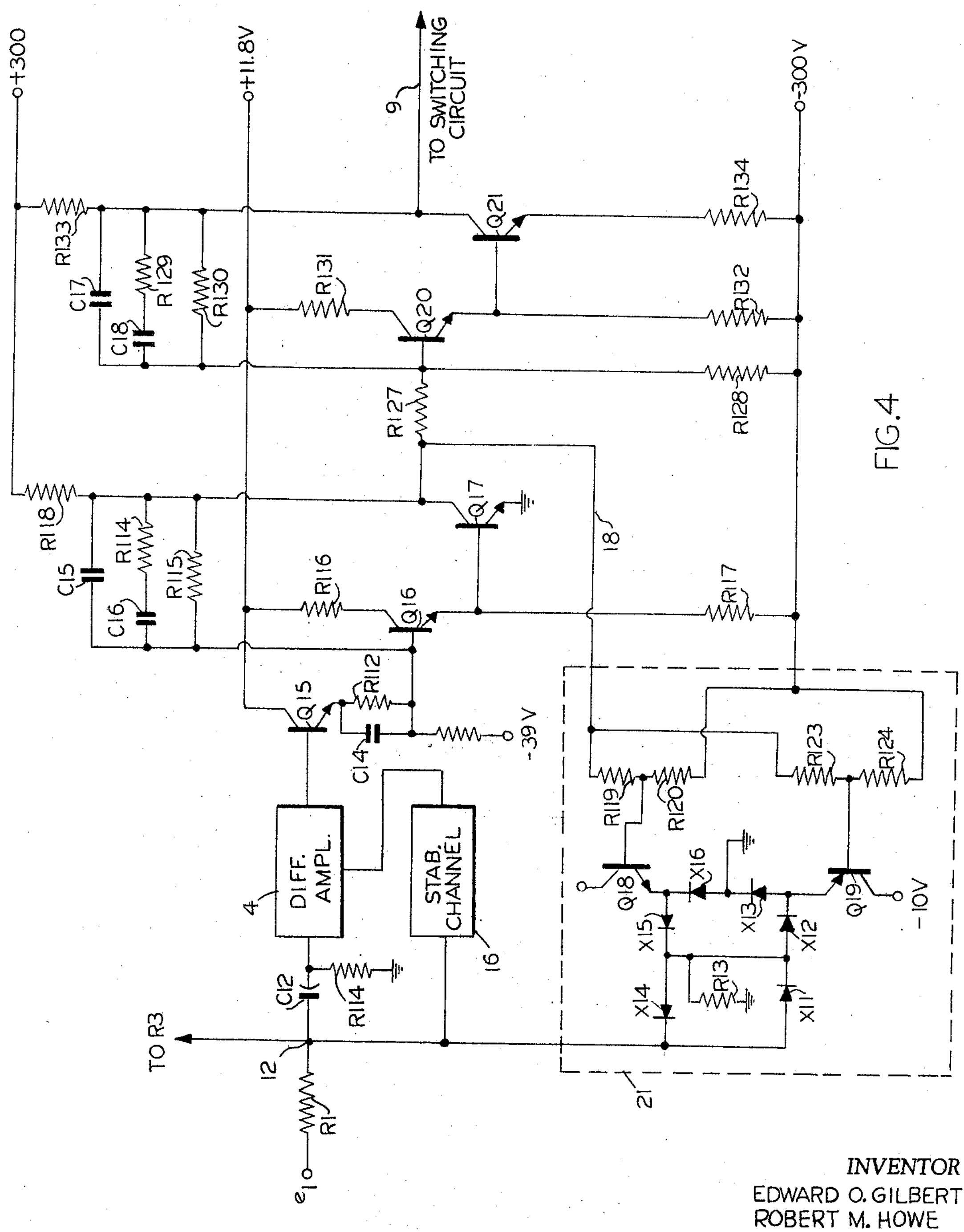

Exemplary forms of preamplifier and feedback limiter suitable for use in accordance with the invention are illustrated in FIG. 4, wherein preamplifier A1 of FIG. 1 is illustrated as including a noninverting difference-determining or "differential" amplifier 4 shown in block form; a noninverting emitter follower stage including transistor Q15, a first inverting stage including transistors Q16 and Q17 connected as a first Darlington pair, and a second Darlington stage including transistors Q20 and Q21 connected to form a second Darlington pair. The two inverting stages provide overall noninversion, as indicated by the + sign at A1 in FIG. 1. The purpose of emitter follower Q15 is to minimize loading of differential amplifier 4. Each Darlington pair provides a considerable amount of current gain and is shown provided with local negative feedback to make its gain characteristic tend to be independent of changes in transistor characteristics. The local negative feedback paths around Q16 and Q17 include resistor R115, capacitor C16 and resistor R114, and capacitor C15.

The output signal from the collector of Q17 of the first Darlington pair is applied via resistor R27 to the base of transistor Q20 of the second pair. The output signal from the collector of transistor Q21 present on terminal 9 comprises the preamplifier A1 output, and as shown in FIG. 1, this signal is applied to switching circuit 15.

The signal at summing junction 12 is applied (through a high-pass filter which includes blocking capacitor C12 and resistor R114) to one input line of differential amplifier 4. The high-pass filter is not an essential portion of the preamplifier, and in some embodiments summing junction 12 may be connected directly into one input line of the differential amplifier. The signal at summing junction 12 is also applied to a conventional stabilizer channel 16, which includes a modulator, AC-coupled amplifier means, a demodulator and a low-pass filter. Channel 16 provides a low frequency drift correction signal to the second input line of differential amplifier 4. Amplifier 4 provides an output signal commensurate with the difference between the two input signals applied to it. One exemplary form of differential amplifier circuit is shown in appl. Ser. No. 471,790 filed July 9, 1965 by Edward O. Gilbert.

As well as being applied to drive the second Darlington pair, the output signal on the Q17 collector is applied via line 18 to feedback limiter means shown within dashed lines at 21 in FIG. 4. The limiter means senses the excursion of the Q17 collector voltage outside a set of predetermined limit values and operates to control the application of a negative feedback signal to summing junction 12 to limit amplifier signal voltages at the amplifier summing junction 12 and output 9 terminals and also within both the preamplifier and within the stabilizer channel.

In a typical application stabilizer channel 16 might have a DC gain of perhaps 1000 and differential amplifier 4, emitter follower Q15 and the first Darlington pair (Q16, Q17) collectively have a high frequency gain of perhaps 300, the second Darlington pair might have a high frequency gain of perhaps 60 and power amplifier AP might have a high frequency gain of about 20, thereby providing overall high frequency gain of 360,000, and a DC gain of 360 million. The specific amplifier and limiter circuits of FIG. 4 are solely exemplary, of course.

In the circuits of FIGS. 1, 2, 2*b*, 3*a* and 3*b*, it should be kept in mind that not only are the analog or limiter outputs available from the output terminal of amplifier AP, AP*b* and AP*c*, but that digital or logic output signals are available as well from terminals 14 (FIG. 1), 14' and 31 (FIG. 2), terminals 31 and 32' (FIG. 2*b*), terminals 35 (FIG. 3*a*) and terminal 14 (FIG 3*b*).

While each of the above-mentioned preamplifiers has been assumed to include an associated stabilizer channel, it should be recognized that loosened accuracy requirements may make stabilization unnecessary at some preamplifiers, and if a given preamplifier utilizes no conventional stabilizer channel, nor similar long time-constant circuit, the associated feedback limiter ordinarily may be dispensed with also, except insofar as limiting is necessary to hold the summing junction at zero or near zero voltage.

What is claimed is:

1. An electronic computer limiter circuit for providing an output signal which varies relative to a predetermined reference potential level in accordance with the relationship between separate and independent first and second simultaneously applied input signals measured with respect to said level, comprising, in combination: first and second direct-coupled preamplifiers each having an input terminal and an output terminal; first drift stabilizer means connected to the input terminal of said first preamplifier and to said reference potential level for stabilizing said first preamplifiers; second drift stabilizer means connected to the input terminal of said second preamplifier and to said reference potential level for stabilizing said second amplifier; a direct-coupled output amplifier having an input terminal and an output terminal; a first input circuit means connected to apply said first input signal to the input terminal of said first preamplifier; a second input circuit means connected to apply said second input signal to the input terminal of said second preamplifier; a first feedback impedance connected between the output terminal of said output amplifier and the input terminal of said first preamplifier; a second feedback impedance connected between the output terminal of said ouput amplifier and the input terminal of said second preamplifier; a selective electronic switching circuit connected to the output terminals of said first and second preamplifiers and to the input terminal of said output amplifier to apply the one preamplifier output signal having a predetermined polarity relative to the other preamplifier output signal to the input terminal of said output amplifier; a first feedback limiter circuit connected between the output and input terminals of said first preamplifier to apply a feedback current to said input terminal of said first preamplifier when the output signal from said first preamplifier tends to exceed a predetermined magnitude; and a second feedback limiter circuit connected between the output and input terminals of said second preamplifier to apply a feedback current to said input terminal of said second preamplifier when the output signal from said second preamplifier tends to exceed a predetermined magnitude.

2. Apparatus according to claim 1 having further means controlled by a logic signal, and circuit means connecting the output signal of a predetermined one of said preamplifiers to supply said logic signal to said further means.

3. Apparatus according to claim 1 in which said electronic switching circuit comprises first and second transistors of like conductivity type having their collector-emitter circuits connected across a potential source through a common impedance, the output signals of said preamplifiers being respectively connected to the bases of said transistors.

4. A circuit according to claim 1 having a third direct-coupled preamplifier having an input terminal and an output terminal; third drift stabilizer means connected to the input terminal of said third preamplifier and to said reference potential level for stabilizing said third preamplifier; a third input circuit means connected to apply a third input signal to the input terminal of said third preamplifier; a third feedback impedance connected between the output terminal of said output amplifier and the input terminal of said third preamplifier, said selective switching circuit being connected to the output signal of said third preamplifier and being operative to apply either said one preamplifier output signal or the output signal of said third preamplifier to the input terminal of said output amplifier; and a third feedback limiter circuit connected between the output and input terminals of said third preamplifier to apply a feedback current to said input terminal of said third preamplifier when the output signal from said third preamplifier exceeds a predetermined magnitude.

5. A circuit according to claim 4 in which said selective switching circuit includes means for comparing said one preamplifier output signal with the output signal of said third preamplifier and for automatically applying one or the other to the input terminal of said output amplifier in accordance with the relative polarity between said one preamplifier output signal and the output signal of said third preamplifier.

6. A circuit according to claim 4 in which said selective switching circuit includes an electronic switch controlled by an externally-generated control signal for applying either said one preamplifier output signal or the output signal of said third preamplifier to the input terminal of said output amplifier.

7. A circuit according to claim 1 in which each of said drift stabilizer means comprises means for modulating the input signal of one of said preamplifiers with respect to said reference level to provide an alternating signal, means for amplifying and demodulating said alternating signal to provide a drift correction signal, and means for applying said drift correction signal to one of said preamplifiers.

8. A circuit according to claim 1 in which each of said preamplifiers comprises one or more direct-coupled amplifier stages and in which each of said feedback limiter circuits comprises current-controlling means biased to a normally non-conducting condition, and means for applying the output signal of one of said amplifier stages to said current-controlling means to switch said current-controlling means to a conducting condition to apply current to the input terminal of the preamplifier when the output signal of the preamplifier tends to exceed said predetermined magnitude.

9. In an electronic computer limiter circuit having a plurality of high-gain direct-coupled preamplifiers connected to receive respective input signals and provide respective output signals, a selective-switching circuit connected to receive the output signals from said preamplifiers and apply a selected one of said output signals to an output circuit, and a plurality of feedback impedances connected respectively between said output circuit and the input circuits of individual ones of said preamplifiers, the combination of a plurality of draft stabilizer means, each of said drift stabilizer means being connected to the input circuit of a respective one of said preamplifiers and to a reference potential level to stabilize a respective one of said preamplifiers; and a plurality of feedback limiter circuits, each of said feedback limiter circuits being connected between the output and input terminals of a respective one of said preamplifiers to apply a feedback current to a respective one of said preamplifiers when the output signal of said respective one of said preamplifiers exceeds a predetermined magnitude, thereby to limit the signal at the input terminals of all of the other preamplifiers when said selective switching means connects the output signal of a given one of said preamplifiers to said input terminal of said output amplifier.

10. A limiter circuit according to claim 9 in which said output circuit comprises a direct-coupled output amplifier connected to receive said selected one of said output signals from said preamplifiers and to apply the output signal from said output amplifier to each of said three feedback impedances.

11. An electronic integrator circuit, comprising, in combination: first, second and third direct-coupled preamplifiers each having an input terminal and an output terminal; an output amplifier having an input terminal and an output terminal; a first input impedance for applying an input signal to be integrated to the input terminal of said first preamplifier; a first capacitor connected between the output terminal of said output amplifier and the input terminal of said first preamplifier; a second capacitor connected between the output amplifier and the input terminal of said second preamplifier; first selective switching means for connecting the output terminal of said first preamplifier to the input terminal of said output amplifier, to cause the output voltage at said output terminal of said output amplifier to vary as the time integral of said input signal with an integrating time-constant determined by said first input impedance and said first capacitor and said second capacitor becomes charged to the value of said output voltage; second selective switching means for connecting the output terminal of said second preamplifier to the input terminal of said output amplifier, to cause the output voltage of said output amplifier to be held constant; means for applying a second input signal to the input terminal of said third preamplifier; a resistance connected between the output terminal of said output amplifier and the input terminal of said third preamplifier; and third selective switching means for connecting the output terminal of said third preamplifier to the input terminal of said output amplifier, to cause the output voltage of said output amplifier to be driven to a value commensurate with the value of said second input signal.

12. A circuit according to claim 11 in which the capacity of said second capacitor is greater than the capacity of said first capacitor.

13. A circuit according to claim 11 having drift-stabilizer means and a feedback limiter connected to at least one of said preamplifiers, said one of said preamplifiers comprising one or more direct-coupled amplifier stages, said drift stabilizer means comprising means for modulating the input signal at the input terminal of said one of said preamplifiers to provide an alternating signal, means for amplifying and demodulating said alternating signal to provide a drift correction signal, and means for applying said drift correction signal to said one of said preamplifiers, said feedback limiter comprising current-controlling means biased to a normally non-conducting condition and means for applying the output signal of one of said amplifier stages of said one of said preamplifiers to switch said current-controlling means to a conducting condition when the output signal of said one of said preamplifiers tends to exceed a predetermined magnitude.

References Cited

UNITED STATES PATENTS

| | | | |
|---|---|---|---|
| 2,997,660 | 8/1961 | Young | 330—84 X |
| 3,204,118 | 8/1965 | Rotier | 307—229 |
| 2,980,861 | 4/1961 | Popowsky | 330—147 |

NATHAN KAUFMAN, Primary Examiner

U.S. Cl. X.R.

330—3, 24, 26, 30, 51